United States Patent
Shu et al.

(10) Patent No.: US 10,685,840 B2
(45) Date of Patent: Jun. 16, 2020

(54) GATE STRUCTURES

(71) Applicant: GLOBALFOUNDRIES INC., Grand Cayman (KY)

(72) Inventors: Jiehui Shu, Clifton Park, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/193,960

(22) Filed: Nov. 16, 2018

(65) Prior Publication Data

US 2020/0161136 A1    May 21, 2020

(51) Int. Cl.
| | | |
|---|---|---|
| *H01L 29/76* | (2006.01) | |
| *H01L 21/8234* | (2006.01) | |
| *H01L 29/51* | (2006.01) | |
| *H01L 29/78* | (2006.01) | |
| *H01L 27/088* | (2006.01) | |
| *H01L 21/28* | (2006.01) | |
| *H01L 23/535* | (2006.01) | |
| *H01L 29/49* | (2006.01) | |
| *H01L 29/66* | (2006.01) | |

(52) U.S. Cl.
CPC .. *H01L 21/28123* (2013.01); *H01L 21/28088* (2013.01); *H01L 21/823431* (2013.01); *H01L 21/823437* (2013.01); *H01L 21/823468* (2013.01); *H01L 21/823475* (2013.01); *H01L 23/535* (2013.01); *H01L 27/0886* (2013.01); *H01L 29/4966* (2013.01); *H01L 29/4983* (2013.01); *H01L 29/66545* (2013.01)

(58) Field of Classification Search
CPC ............ H01L 29/4983; H01L 29/6653; H01L 29/6656; H01L 29/7833; H01L 29/665; H01L 29/6659
See application file for complete search history.

(56) References Cited

U.S. PATENT DOCUMENTS

| | | | |
|---|---|---|---|
| 5,817,562 A * | 10/1998 | Chang | H01L 21/76897 438/305 |
| 6,924,178 B2 | 8/2005 | Beintner | |
| 7,087,471 B2 | 8/2006 | Beintner | |
| 2004/0023478 A1 * | 2/2004 | Samavedam | H01L 21/823814 438/592 |
| 2006/0079060 A1 * | 4/2006 | Kwon | H01L 21/823425 438/300 |
| 2007/0267678 A1 * | 11/2007 | Lo | H01L 29/4983 257/314 |
| 2009/0020828 A1 * | 1/2009 | Yamada | H01L 21/823807 257/379 |
| 2013/0020616 A1 * | 1/2013 | Ayala | H01L 29/7843 257/288 |
| 2015/0179503 A1 | 6/2015 | Tsai et al. | |
| 2015/0263131 A1 | 9/2015 | Metz | |
| 2018/0211883 A1 * | 7/2018 | Cheng | H01L 21/823487 |

* cited by examiner

*Primary Examiner* — Brian Turner

(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to gate structures and methods of manufacture. The structure includes: a plurality of gate structures comprising a gate cap, sidewall spacers and source and drain regions; source and drain metallization features extending to the source and drain regions; and a liner extending along an upper portion of the sidewall spacers of at least one of the plurality of gate structures.

20 Claims, 12 Drawing Sheets

GATE STRUCTURES

FIELD OF THE INVENTION

The present disclosure generally relates to semiconductor structures and, more particularly, to gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

For example, in the fabrication of gate structures, the gate height after an interlevel dielectric fill is set by the spacers of the gate structure and an etch stop line. However, the gate structures can suffer from gate height loss after pulling of the dummy gate, gate cut and replacement metal gate processes. This loss in gate height can result in a short between the metal material of the gate structures and the metal material used to form the source and drain contacts.

SUMMARY

In an aspect of the disclosure, a structure comprises: a plurality of gate structures comprising a gate cap, sidewall spacers and source and drain regions; source and drain metallization features extending to the source and drain regions; and a liner extending along an upper portion of the sidewall spacers of at least one of the plurality of gate structures.

In an aspect of the disclosure, a structure comprises: a plurality of gate structures comprising source/drain regions, gate material, sidewall spacers and a gate cap on the gate material; a plurality of source/drain contacts in electrical contact with the source/drain regions; an insulator material adjacent to at least one of the plurality of gate structures; and a liner extending partially along an upper portion of the sidewall spacers of at least one of the plurality of gate structures, above and below the insulator material.

In an aspect of the disclosure, a method comprises: forming a plurality of gate structures comprising source/drain regions, a gate material, sidewall spacers and a gate cap on the gate material; forming a liner extending partially along an upper portion of the sidewall spacers of at least one of the plurality of gate structures; and a plurality of source/drain contacts in electrical contact with the source/drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to gate structures and methods of manufacture. In embodiments, the processes and structures provided herein use liners and insulator fills to prevent gate height loss during fabrication of the source and drain contacts. Advantageously, by preserving the gate height of the gate structures, gate structures can be formed with a larger gate cap. This larger gate cap prevents shorts between the metal material of the gate structure and the metal material used to form the source and drain contact.

The processes and structures described herein prevent gate height loss by performing an interlevel dielectric (ILD) fill, planarization and recess, along with a relatively thin liner deposition over the ILD and ILD recess. An oxide fill is formed over the relatively thin liner, followed by a recess of the oxide fill and deposition of a second relatively thin liner over the oxide fill. In embodiments, a gate cut is filled with a Si fill. The deposition of the liners and insulator fill allow for a gate height of dummy gate structures to be increased in order to preserve the gate height for the replacement gate structures. More specifically, the oxide fills and liners protect the etch stop liner and the spacers of the gate structures, thereby preserving gate height.

Dummy gate structures are pulled and replacement metal gate structures are formed without any gate height loss. In embodiments, the replacement gate structures will have a substantial gate height, allowing for a larger gate cap to be formed. Metallization features to the source and drain regions are isolated from the gate metal by the larger gate cap and the preserved sidewall spacers, thereby preventing shorting between the gate structures and the metallization features of the source and drain regions.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
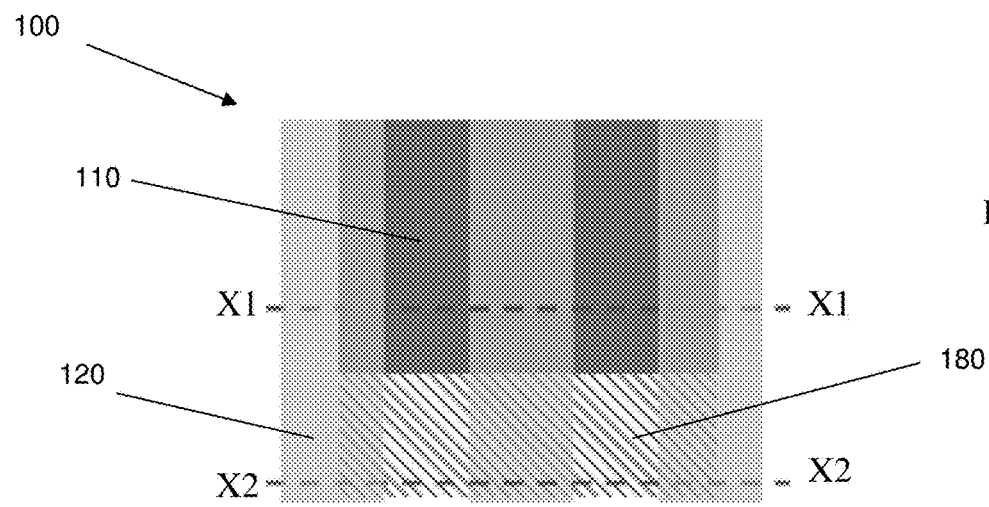
FIGS. 1A-1C show dummy gate structures, amongst other features, and respective fabrication processes in accordance with aspects of the present disclosure.
Figure 1B:
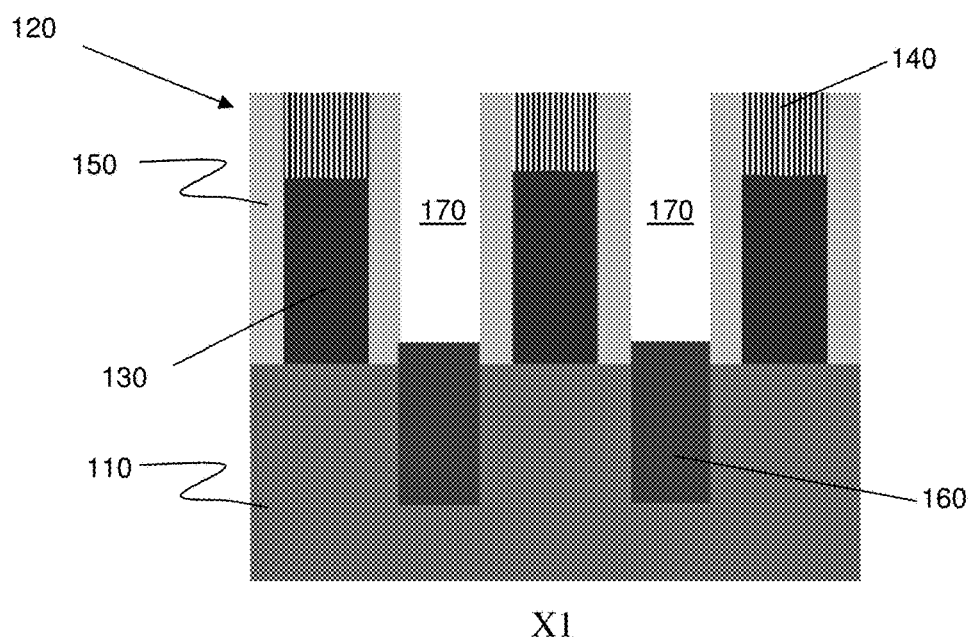
Figure 1C:
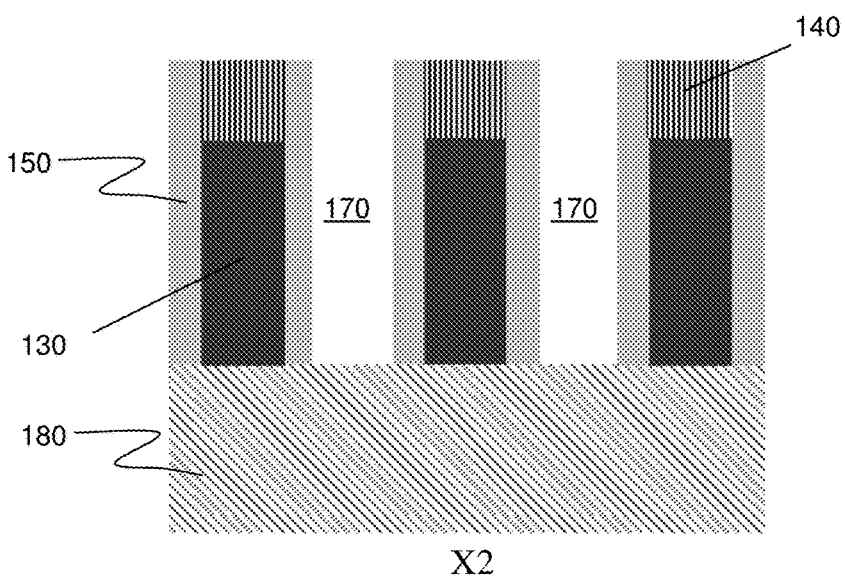

FIGS. 1A-1C show an incoming structure and respective fabrication processes in accordance with aspects of the present disclosure. Specifically, FIG. 1A depicts a top view of a structure 100, FIG. 1B depicts the structure 100 along X1 and FIG. 1C depicts the structure 100 along X2. Referring to FIGS. 1A-1C, the structure 100 comprises a fin structure 110 composed of a suitable semiconductor material. For example, the fin structure 110 may be composed of any suitable material including, but not limited to, Si, SiGe, SiGeC, SiC, GaAs, InAs, InP, etc.

The fin structure 110 can be fabricated using a sidewall image transfer (SIT) technique. In an example of a SIT technique, a mandrel material, e.g., $SiO_2$, is deposited on a substrate using conventional chemical vapor deposition (CVD) processes. A resist is formed on the mandrel material and exposed to light to form a pattern (openings). A reactive ion etching is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, e.g., for structures. The sidewall spacers can then be stripped.

Still referring to FIGS. 1A-1C, gate structures 120 are formed on the fin structure 110 and on the shallow trench isolation (STI) region 180. In embodiments, the gate structures 120 can have a height of about 20 nm and are composed of a dummy gate material 130, e.g., poly Si, and a capping layer 140. The capping layer 140 can be formed of any suitable hardmask material, e.g., SiN, amongst other examples. The gate structures 120 further include sidewall spacers 150, e.g., a low-k dielectric, which can be deposited on the sidewalls of the gate structures 120. The sidewall spacers 150 can be deposited by conventional chemical vapor deposition (CVD) processes followed by a patterning process, e.g., anisotropic etching process, to remove any material from horizontal surfaces of the structure 100.

Source and drain regions (S/D) regions 160 are formed on sides of the gate structures 120, e.g., sides of the sidewall spacers 150, in the fin structure 110 using, e.g., any conventional method. For example, the S/D regions 160 can be raised S/D regions formed by an epi growth on the surfaces of the fin structure 110, within the openings 170 between the gate structures 120. In further embodiments, the S/D regions 160 can be formed by an ion implantation process, doping process or through a diffusion processes, as is well known to those of skill in the art such that no further explanation is required for an understanding of the present disclosure.

Figure 2A:
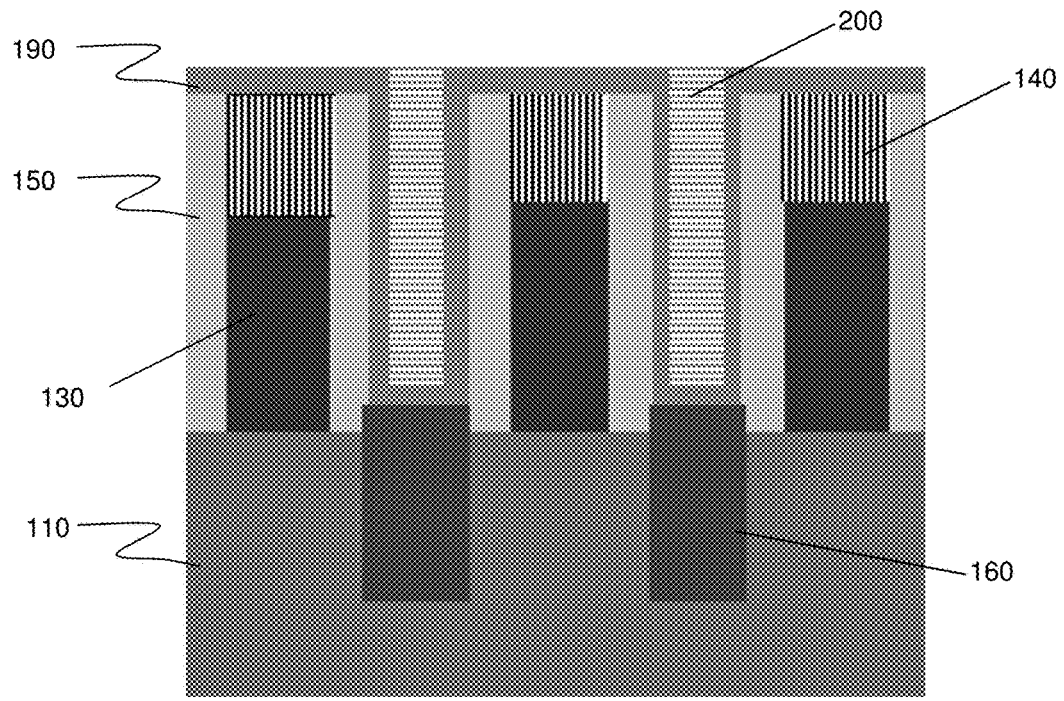
FIGS. 2A and 2B show an etch stop liner, amongst other features, and respective fabrication processes in accordance with aspects of the present disclosure.
Figure 2B:
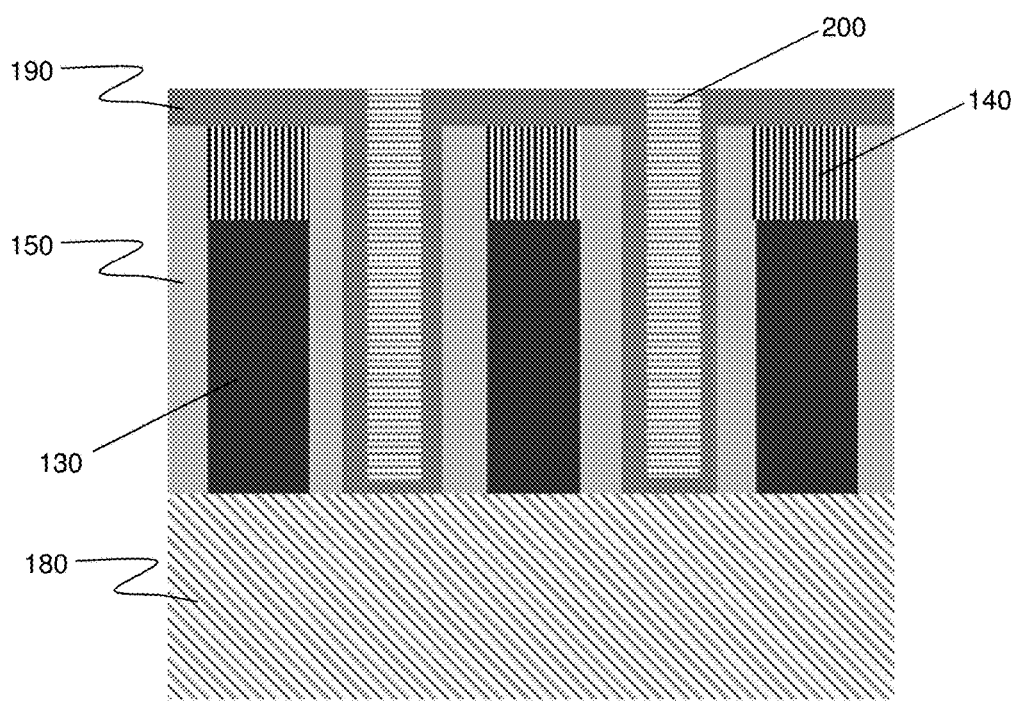

FIGS. 2A and 2B show an etch stop liner 190 deposited within the openings 170 and over the gate structures 120 and, more specifically, the S/D regions 160. In embodiments, the etch stop liner 190 can be composed of any suitable material, e.g., SiN, and can be deposited by CVD processes. In further embodiments, the etch stop liner 190 can be deposited to have a thickness in a range of about 1 nm to 6 nm, with 4 nm being a preferable thickness for the etch stop liner 190. An interlevel dielectric (ILD) 200 is deposited within the openings 170 and over the S/D regions 160 and etch stop liner 190. The ILD 200 can be deposited by CVD processes and is composed of oxide, for example. The ILD 200 is planarized by a chemical mechanical polishing (CMP) process.

Figure 3A:
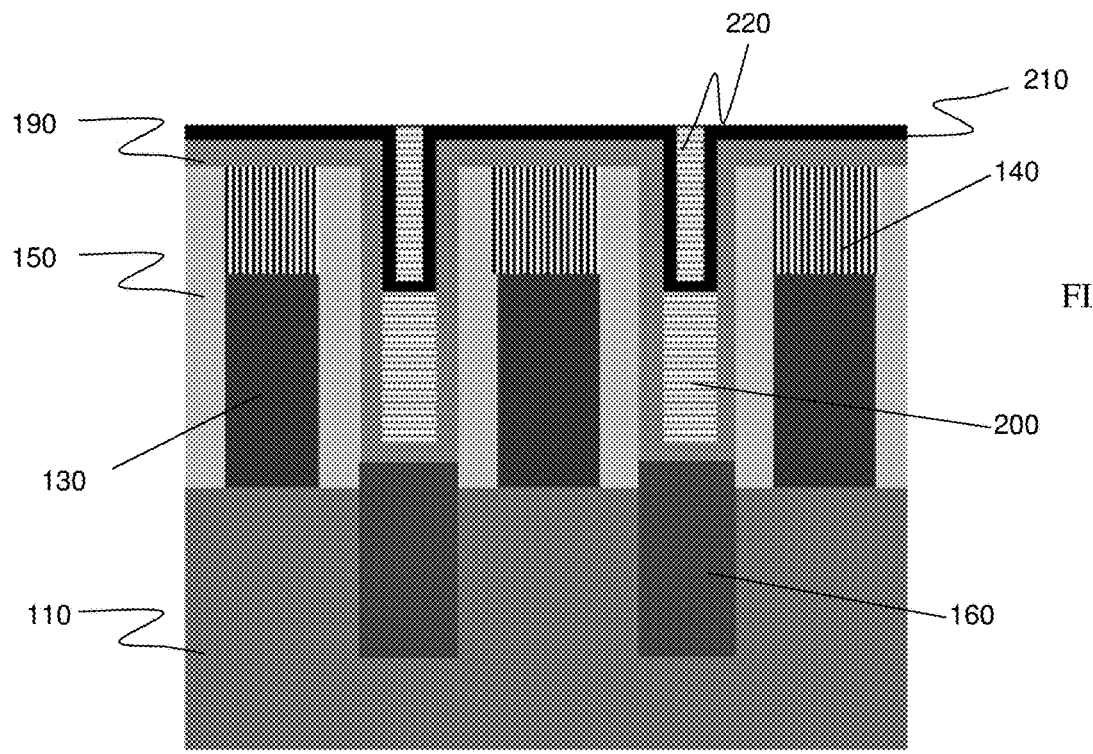
FIGS. 3A and 3B show an oxide fill, amongst other features, and respective fabrication processes in accordance with aspects of the present disclosure.
Figure 3B:
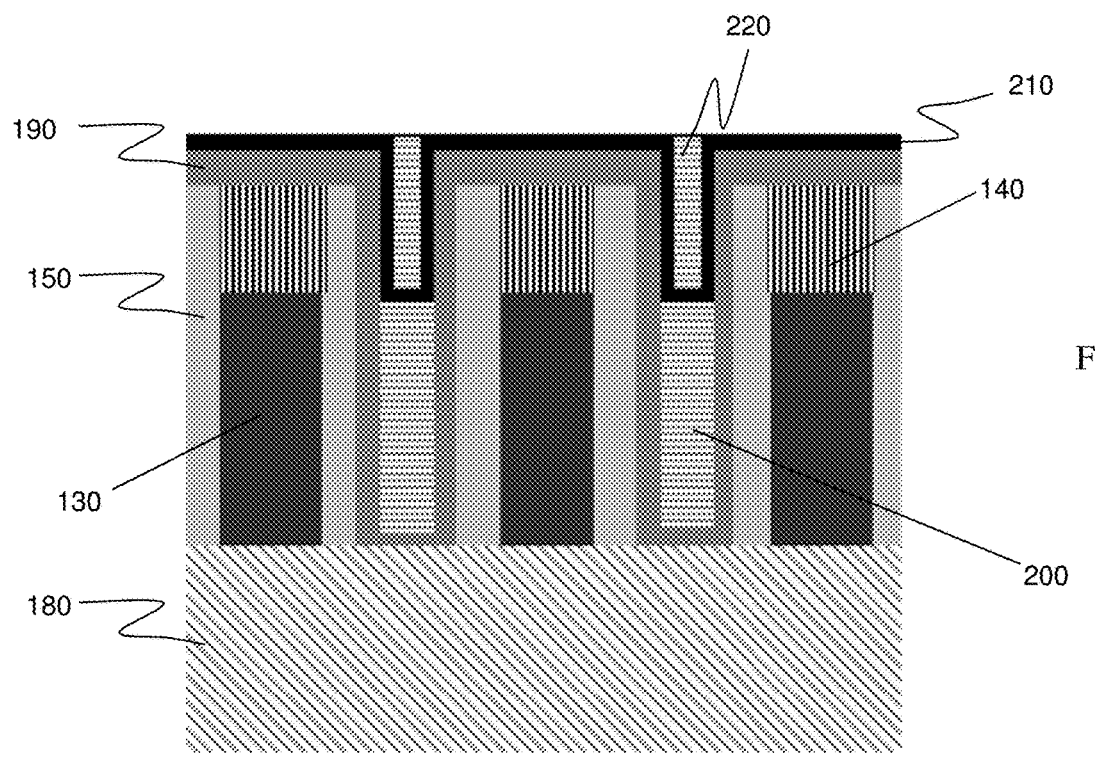

FIGS. 3A and 3B show recesses in the ILD 200, which are lined by a relatively thin conformal liner 210. The recesses can be at a height which is equal or similar to a top surface height of the dummy material of the gate structures 120, or the recesses can extend below the top surface height of the dummy material of the gate structures 120. In embodiments, the liner 210 can be deposited within the recesses by physical vapor deposition (PVD) or CVD processes, and is comprised of a metal oxide or nitride material, such as $HfO_2$, $TiO_2$, $Al_2O_3$ and AlN, amongst other examples. In embodiments, the liner 210 can have a thickness of about 1 nm.

An oxide fill 220 is deposited, e.g., by CVD processes, over the liner 210. In embodiments, the oxide fill 220 is polished by a CMP process, which stops on the liner 210 due to the selectivity between the oxide fill 220 and the liner 210. During the deposition of the oxide fill 220, the liner 210 prevents damage to the low-k sidewall spacers 150 from the deposition process. By protecting the sidewall spacers 150, a gate height of the gate structures 120 can be maintained.

Figure 4A:
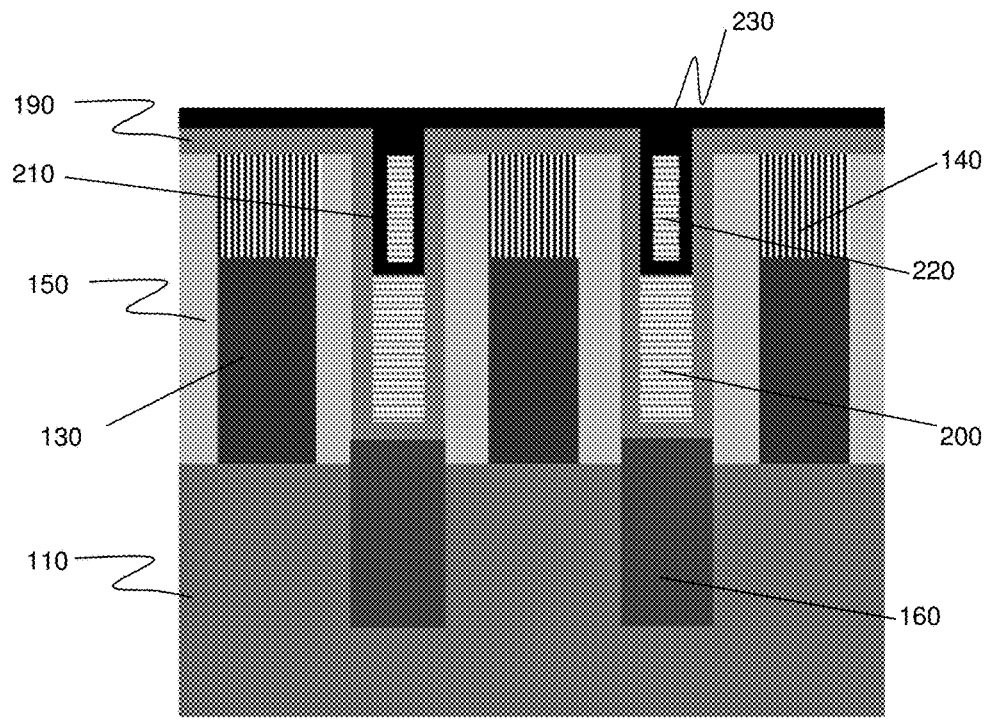
FIGS. 4A and 4B show a liner, amongst other features, and respective fabrication processes in accordance with aspects of the present disclosure.
Figure 4B:
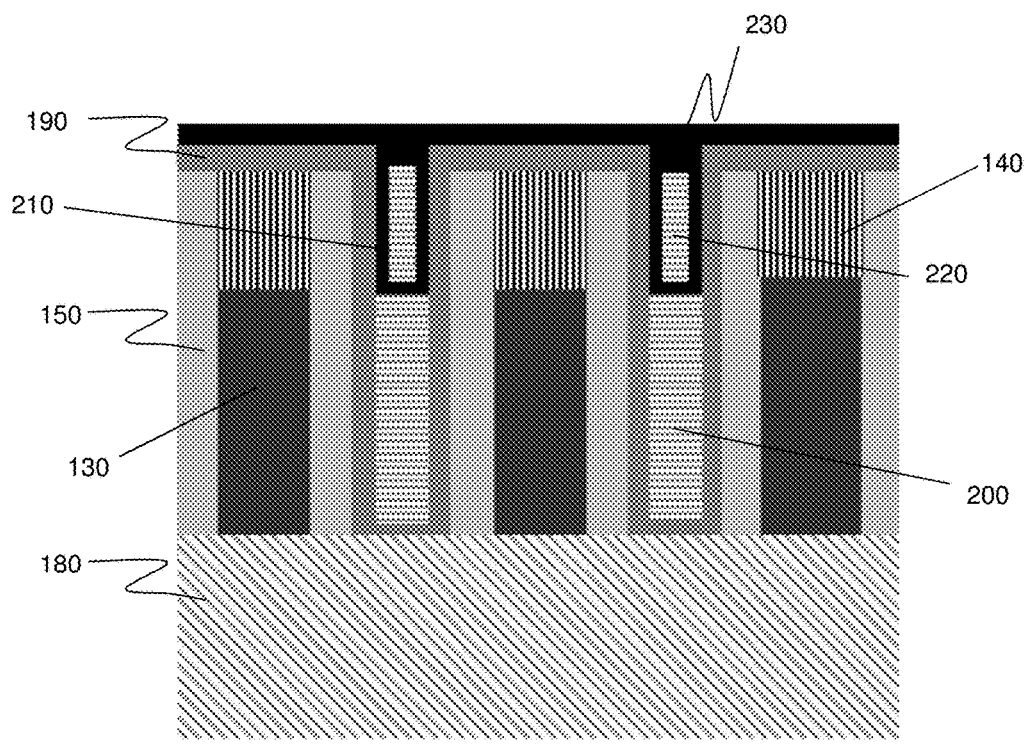

FIGS. 4A and 4B show recesses in the oxide fill 220 filled with a liner 230, which is deposited over the liner 210 and the oxide fill 220. In embodiments, the recesses have a depth in a range of about 5 nm to 10 nm; although other dimensions are contemplated herein. The liner 230 can be deposited by PVD or CVD processes, and is comprised of a metal oxide or nitride material such as $HfO_2$, $TiO_2$, $Al_2O_3$ and AlN, amongst other examples. In embodiments, the liner 230 has a thickness which covers a top surface of the oxide fill 220 and prevents any pinch-off from occurring. For example, the liner 230 can have a thickness in a range of about 5 nm to 15 nm, or one-half the width of the opening of the recesses; although other dimensions are contemplated herein. In this way, the liners 210, 230 increase the height of the gate structures 120 to greater than 20 nm.

Figure 5A:
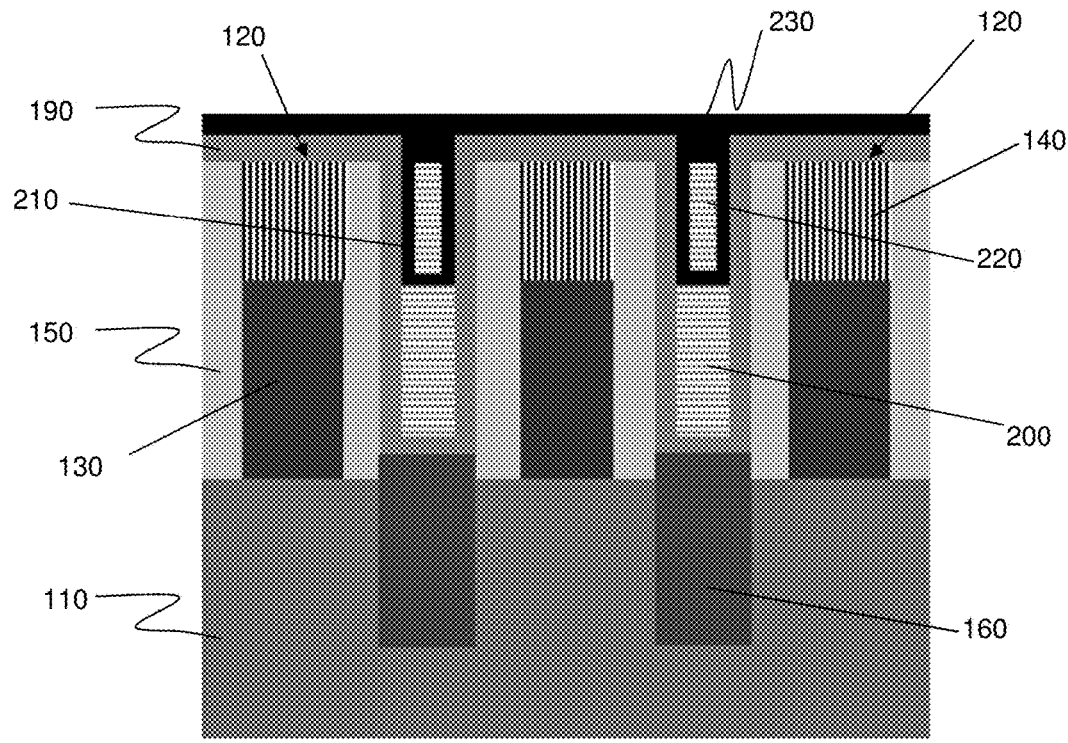
FIGS. 5A and 5B show a gate cut, amongst other features, and respective fabrication processes in accordance with aspects of the present disclosure.
Figure 5B:
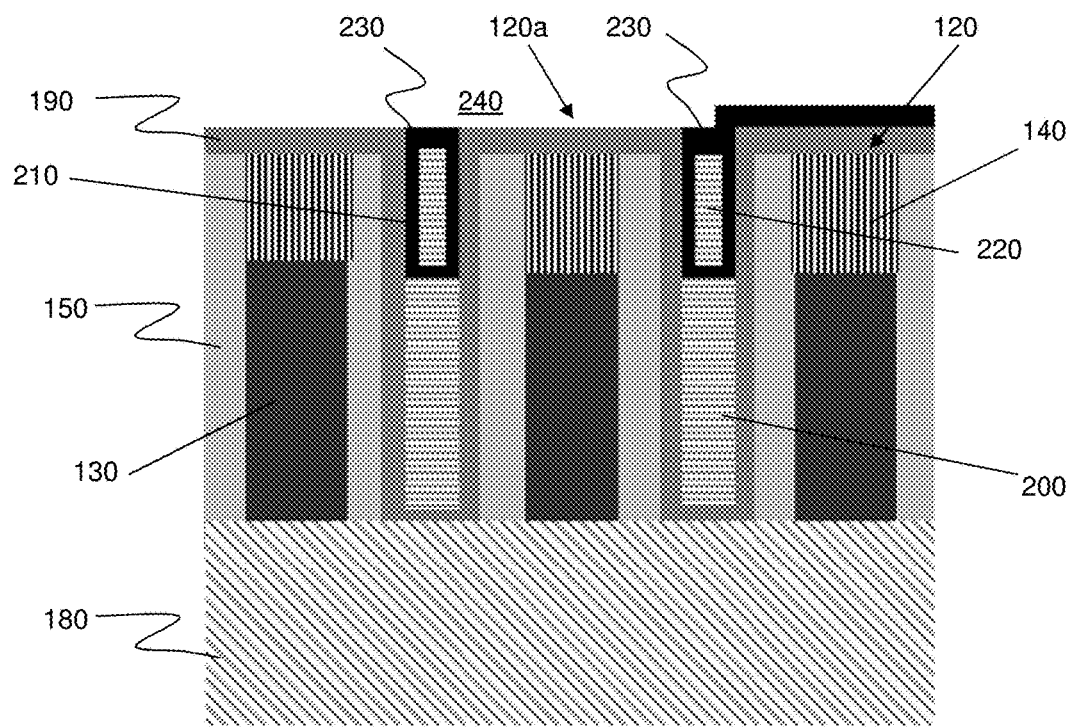

FIGS. 5A and 5B show the gate structures 120, with FIG. 5B showing the etch stop liner 190 over a selected portion 120a of the gate structure 120 exposed by a gate cut 240. In embodiments, the gate cut 240 includes an opening formed in the liners 210, 230 over the select portions 120a of the gate structures 120, by using conventional lithography and etching processes, e.g., reactive ion etching (RIE).

Figure 6A:
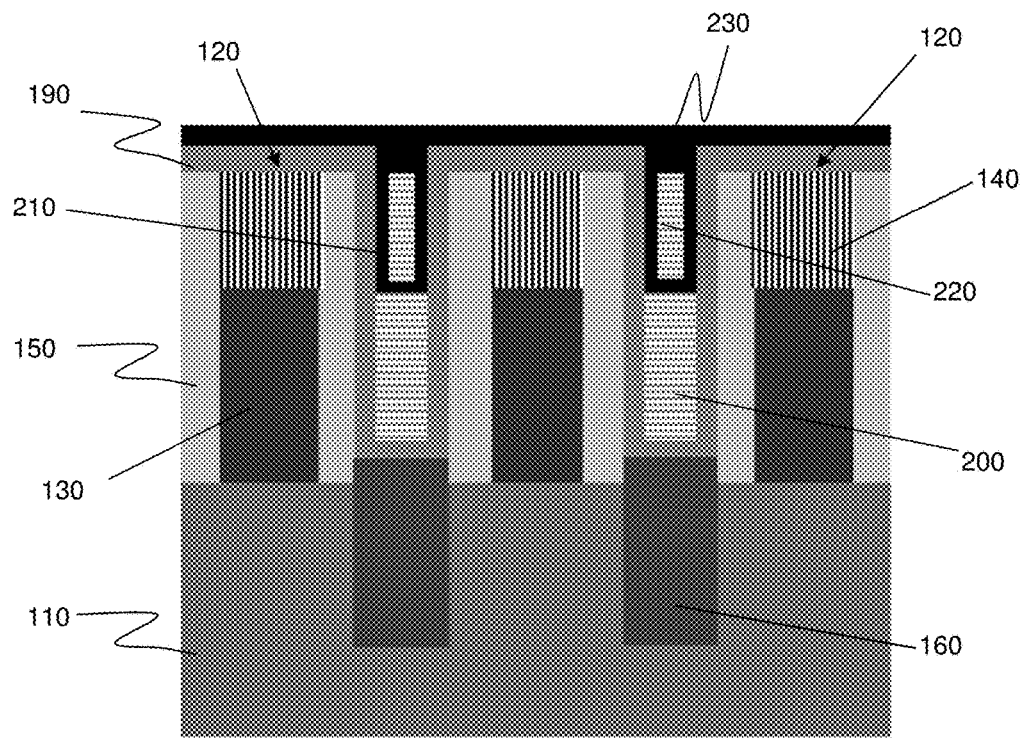
FIGS. 6A and 6B show a Si fill, amongst other features, and respective fabrication processes in accordance with aspects of the present disclosure.
Figure 6B:
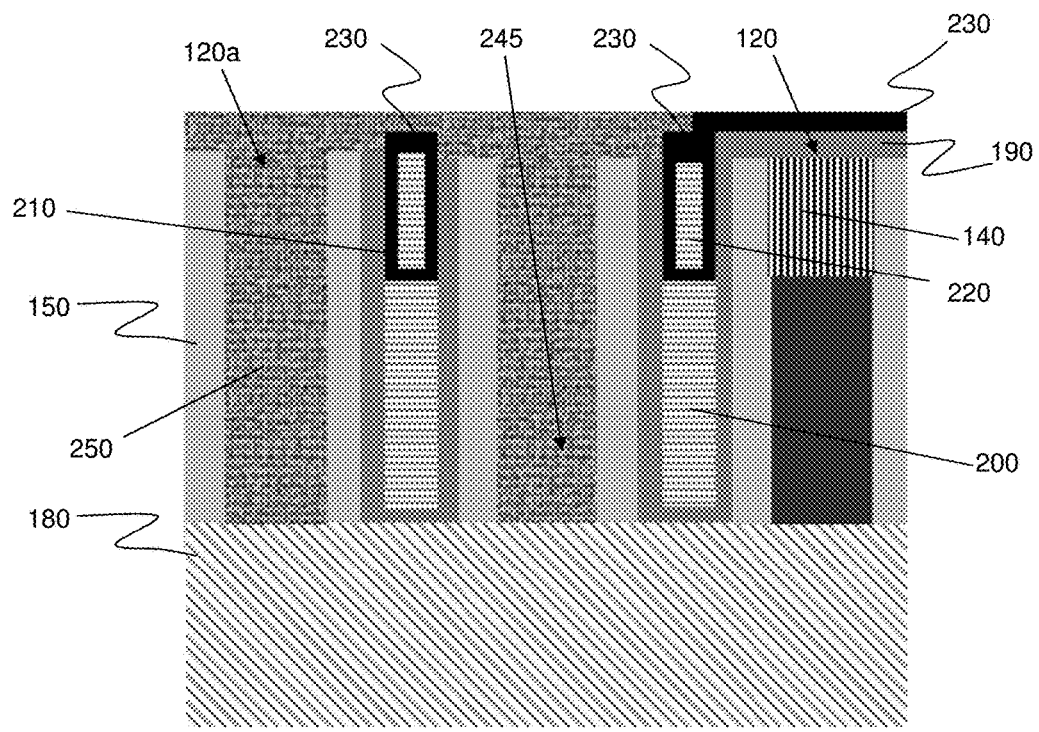

FIGS. 6A and 6B show the gate structures 120, with FIG. 6B showing the select portions 120a of the gate structures 120, which were exposed by the gate cut 240, removed and replaced with an insulator material 250. More specifically, after exposing the select portions 120a of the gate structures 120, trenches are formed by the removal of the dummy gate material 130 and capping layer 140 of the gate structures 120; using conventional lithography and etching techniques, e.g., RIE process. For example, an etching process with a selective chemistry with respect to the low-k dielectric material of the sidewall spacers 150, e.g., RIE, will be used to form one or more trenches 245 between the sidewall spacers 150. The insulator material 250 is deposited within the trenches 245 using, e.g., CVD processes, followed by a CMP process. In embodiments, the insulator material 250 can be composed of any suitable dielectric material which is selective to the material of the sidewall spacers 150. For example, the insulator material 250 can be SiC, while the low-k dielectric material of the sidewall spacers 150 is SiN.

Figure 7A:
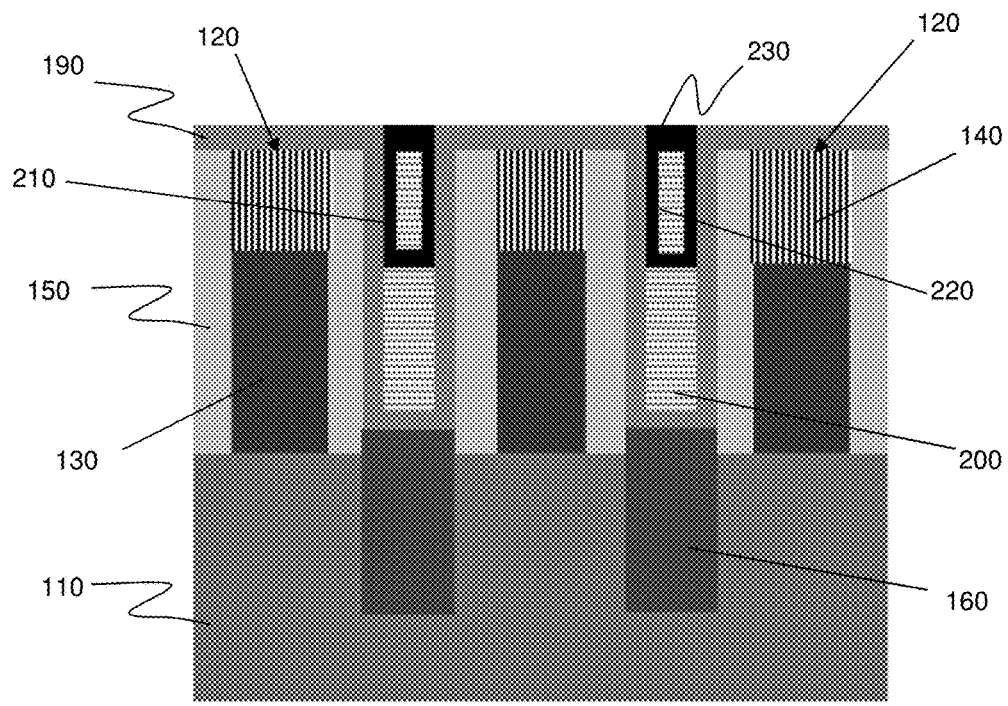
FIGS. 7A and 7B show removal of the liner, amongst other features, and respective fabrication processes in accordance with aspects of the present disclosure.
Figure 7B:
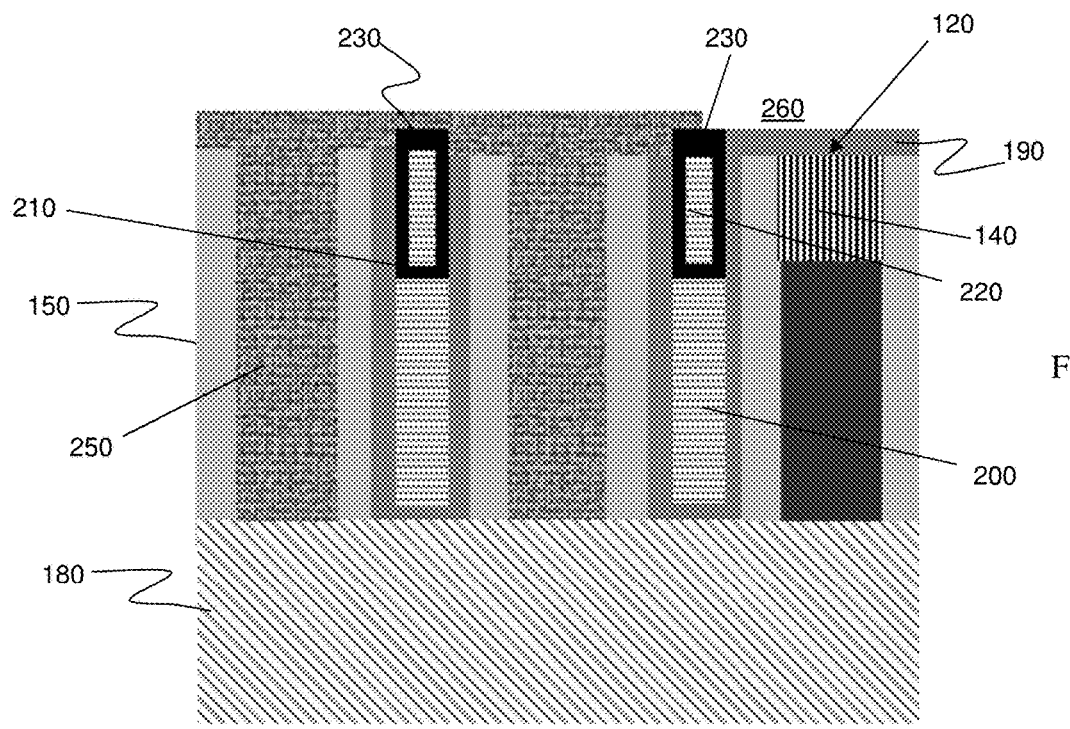

In FIGS. 7A and 7B, liners 210, 230 are removed over the gate structures 120. In FIG. 7B, a recess 260 is formed by the removal of the liners 210, 230. In embodiments, the removal of the liners 210, 230 is a maskless process performed by either a wet etch or a dry etch, which uses chemistries to remove the material of the liners 210, 230 (selective to the remaining materials), for example. The recess 260 partially exposes the liners 210, 230 which remain on the oxide fill 220.

Figure 8A:
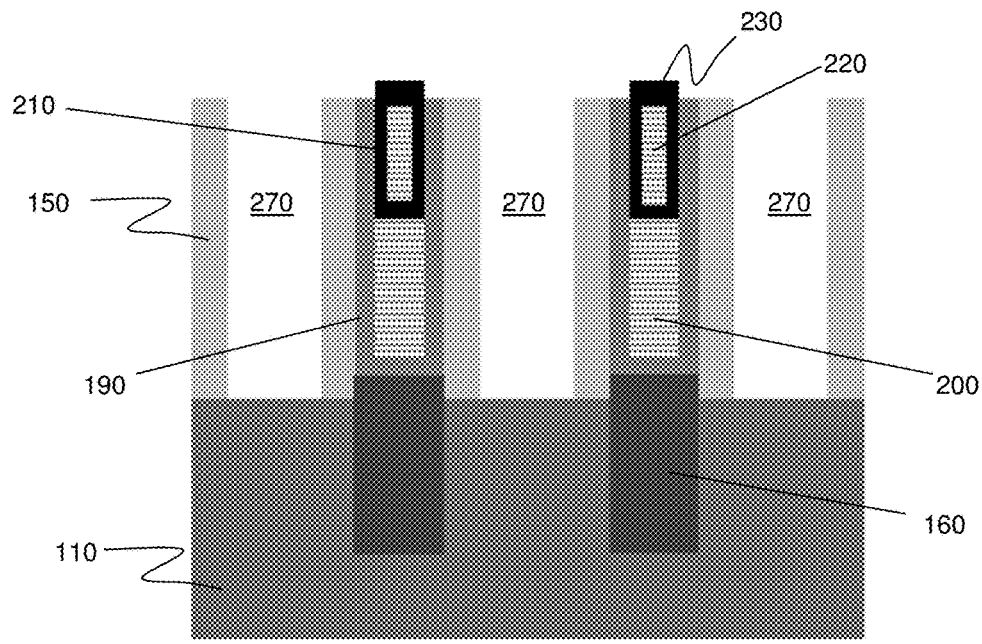
FIGS. 8A and 8B show removal of the dummy gate structures, amongst other features, and respective fabrication processes in accordance with aspects of the present disclosure.
Figure 8B:
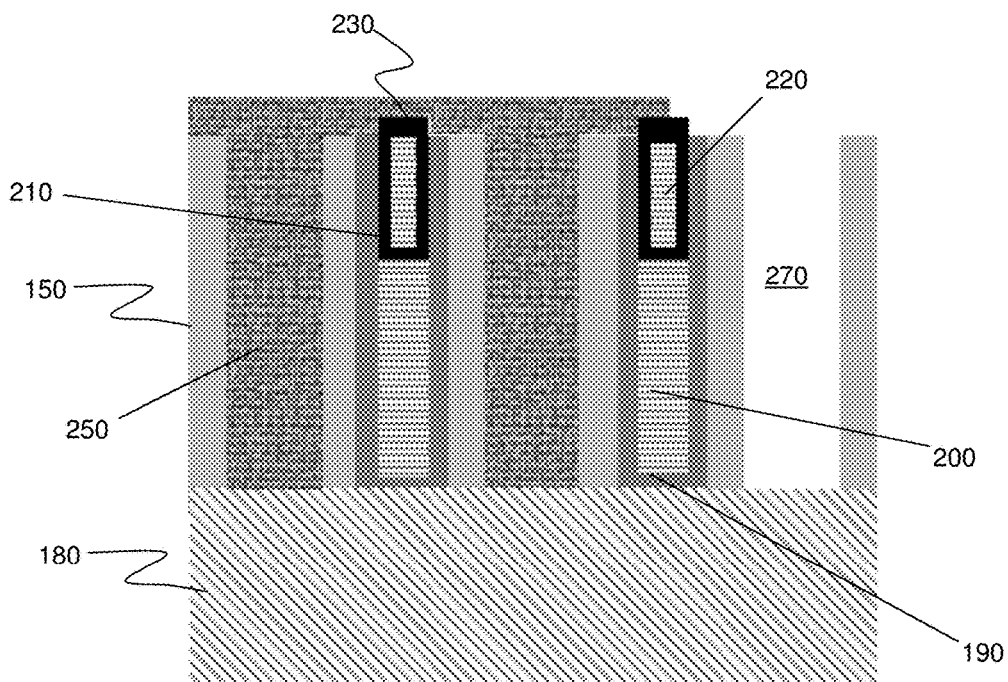

FIGS. 8A and 8B show the formation of trenches 270 by the removal of the gate structures 120 of FIGS. 1A-7B. More specifically, trenches 270 are formed by the removal of the dummy gate material 130 and capping layer 140 of the gate structures 120 using conventional etching techniques, e.g., RIE process. For example, an etching process with a selective chemistry with respect to the low-k dielectric material of the sidewall spacers 150, e.g., RIE, will be used to form the trenches 270 between the sidewall spacers 150.

FIGS. 8A and 8B also show that the gate height has been preserved without any gate height loss, including the height of the sidewall spacers 150. In embodiments, gate height is set by the height of the sidewall spacers 150. Therefore, the protection provided to the sidewall spacers by the liners 190, 210, and 230 and the insulator material 250 allow for the gate height to be maintained, even during the deposition of the ILD 200 and the oxide fill 220. Advantageously, by preserving the gate height of the gate structures 120, including the height of the sidewall spacers 150, replacement gate structures can be formed with a larger gate cap. This larger gate cap will prevent shorts between the metal material of the replacement gate structure and the metal material used to form the source and drain contact.

Figure 9A:
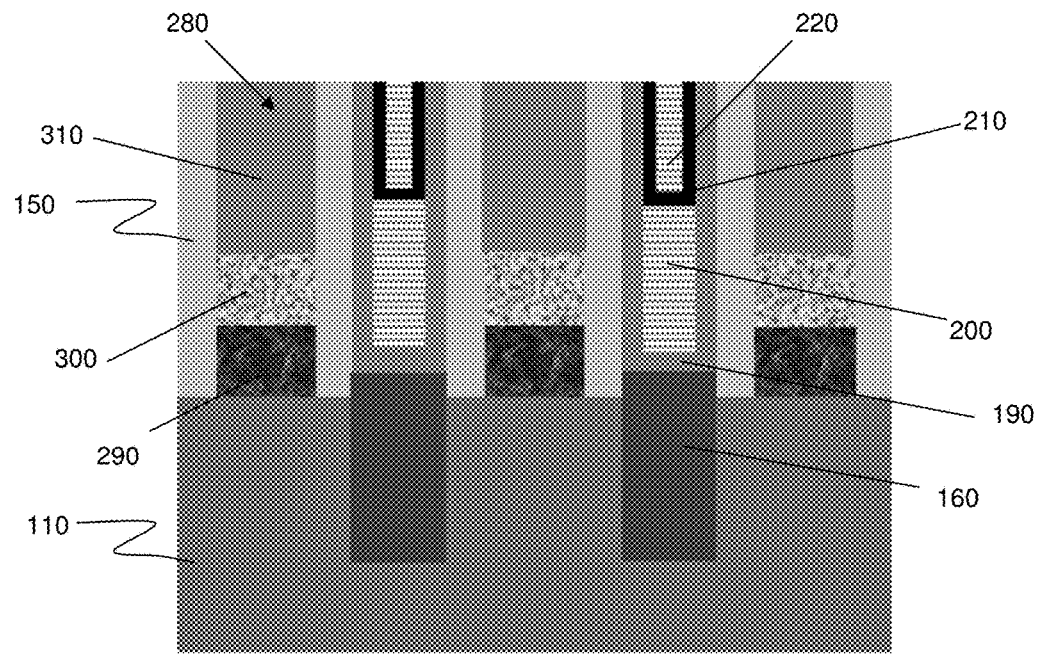
FIGS. 9A and 9B show replacement gate structures, amongst other features, and respective fabrication processes in accordance with aspects of the present disclosure.
Figure 9B:
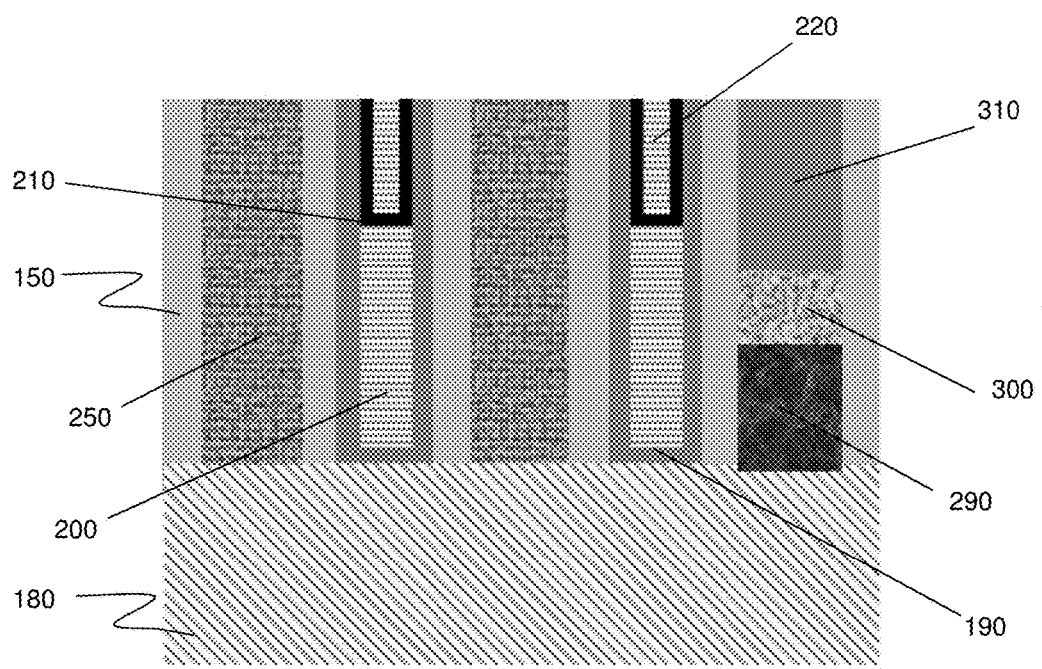

FIGS. 9A and 9B show the formation of the replacement gate structures 280. In embodiments, the insulator material 250 and the liner 230 are polished by a CMP process to a top surface of the sidewall spacers 150. The liner 210 remains and is u-shaped, with an insulator material (oxide fill 220) which surrounds the liner 210, and having an insulator material (oxide fill 220) above the liner 210 and an insulator material (oxide fill 200) below the liner 210. As shown in FIGS. 9A and 9B, the etch stop liner 190 partially encapsulates the insulator materials 200, 220 and the liner 210, with the etch stop liner 190 being adjacent to a sidewall spacer 150 of the at least one of the plurality of gate structures 280. In this way, the liner 210, the insulator materials (oxide fills 200, 220) and the etch stop liner 190 are partially over a source and drain region 160 of the at least one of the plurality of gate structures 280. Further, oxide fill 200 is adjacent to one of the plurality of gate structures 280 and adjacent along a longitudinal axis of remaining gate structures 280 of the plurality of gate structures 280.

The replacement gate structures 280 include a gate dielectric material and metallization features. The gate dielectric material can be, e.g., a high-k gate dielectric material, e.g., hafnium based dielectrics. In embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The metallization features, i.e., the gate metal 290 and the workfunction metal 300, can include any metal or any combination of metals, e.g., tungsten (W), depending on the particular application and design parameters. In embodiments, the gate metal 290 can have a height in a range of about 20 nm to 60 nm, and the workfunction metal 300 can have a height in a range of about 10 nm to 30 nm.

The replacement gate structures 280 also include a gate cap 310 over the gate metal 290 and the workfunction metal 300. As shown in FIGS. 9A and 9B, the plurality of gate structures 280 further comprise a gate metal, i.e., the gate metal 290 and the workfunction metal 300, which has a height that does not extend past a bottom surface of the liner 210. More specifically, the material of the gate cap 310 is deposited within recesses formed over the gate metal 290 and the workfunction metal 300, e.g., using a CVD process, followed by a CMP process. As should be understood, the gate cap 310 will provide protection to the metallization features of the replacement gate structures 280 during subsequent source/drain contact or interconnect formation, e.g., etching processes to form the source/drain contacts or interconnects. The gate cap 310 can be any suitable capping material, e.g., SiN, amongst other examples. In embodiments, a height of the gate cap 310 is greater than the liner 210. In further embodiments, the liner 210 extends partially along the gate cap 310. In this way, the liner 210 is u-shaped. In this way, the gate cap 310 extends below the bottom surface of the liner 210.

By preserving the gate height and specifically the height of the sidewall spacers 150, the replacement gate structures 280 can have a height of about 20 nm; although other dimensions are contemplated herein. This relatively large gate height allows for the gate cap 310 to be larger than conventional gate caps used with conventional processes of record. This relatively larger gate cap 310 prevents shorts between the metal material of the replacement gate structure 280, i.e., gate metal 290 and the workfunction metal 300, and the metallization features to the source and drain (S/D) regions 160. More specifically, the increased height of the gate cap 310 provides further protection of the gate metal 290 and the workfunction metal 300 from the metallization features of the S/D regions 160. In embodiments, the gate cap 310 can have a height in a range of 30 nm to 80 nm. This greater than conventional size allows for shorts to be prevented between the metal material of the replacement gate structures 280 and the metal material used to form the source and drain contacts.

Figure 10A:
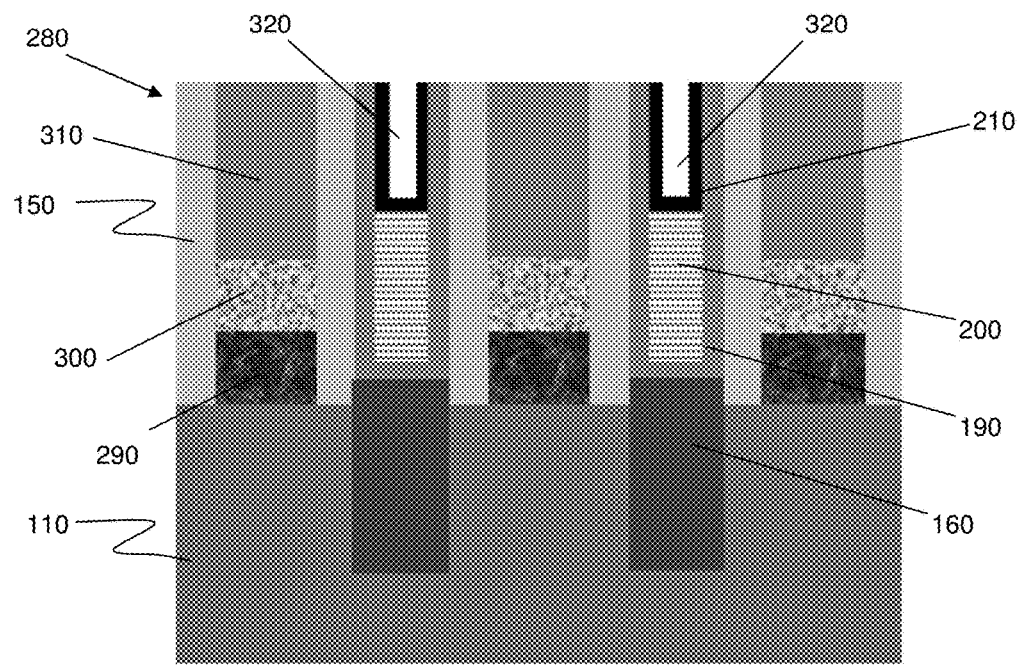
FIGS. 10A and 10B show removal of the oxide fill, amongst other features, and respective fabrication processes in accordance with aspects of the present disclosure.
Figure 10B:
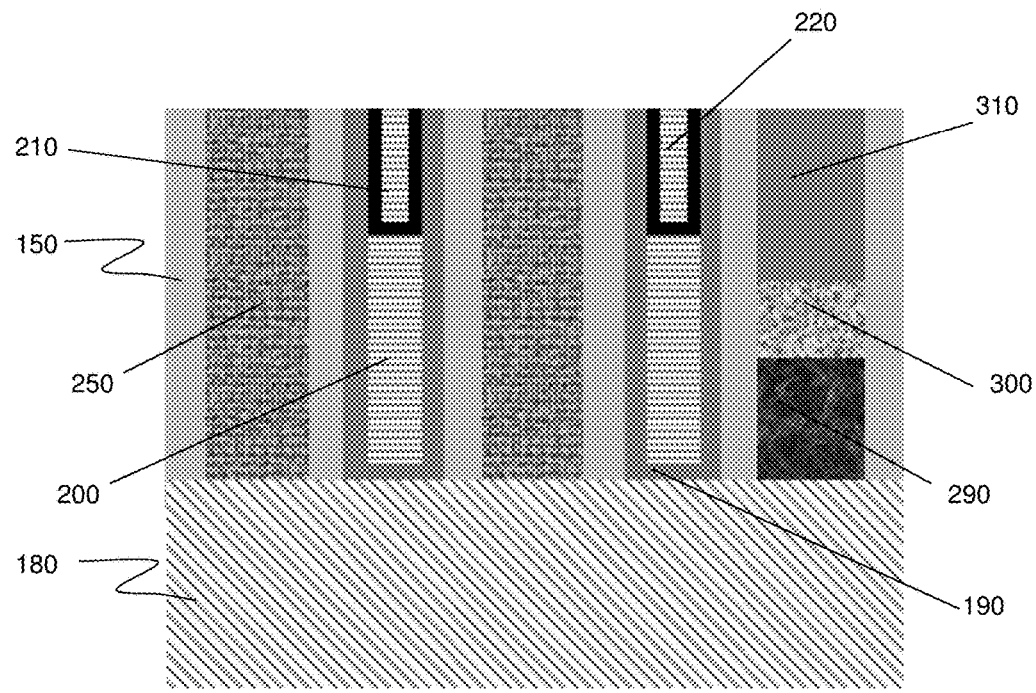

FIG. 10A shows recesses 320 formed by the removal of the oxide fill 220 and FIG. 10B shows the oxide fill 220 being maintained over the STI region 180. In embodiments, the oxide fill 220 can be removed by conventional RIE processes. In embodiments, the etching stops on the liner 210 because of selectivity of the liner 210.

Figure 11A:
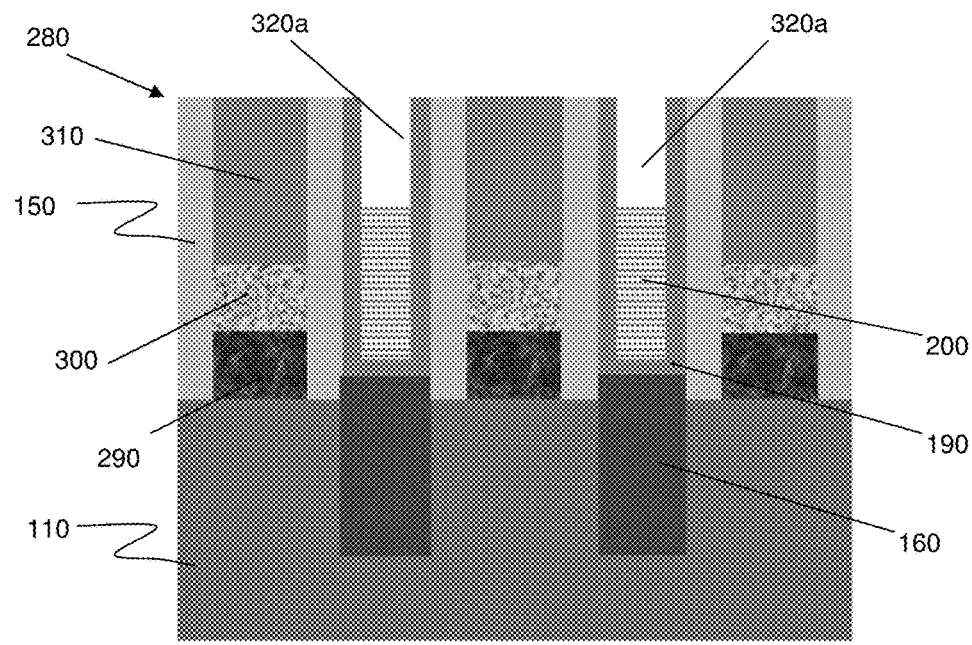
FIGS. 11A and 11B show trenches, amongst other features, and respective fabrication processes in accordance with aspects of the present disclosure.
Figure 11B:
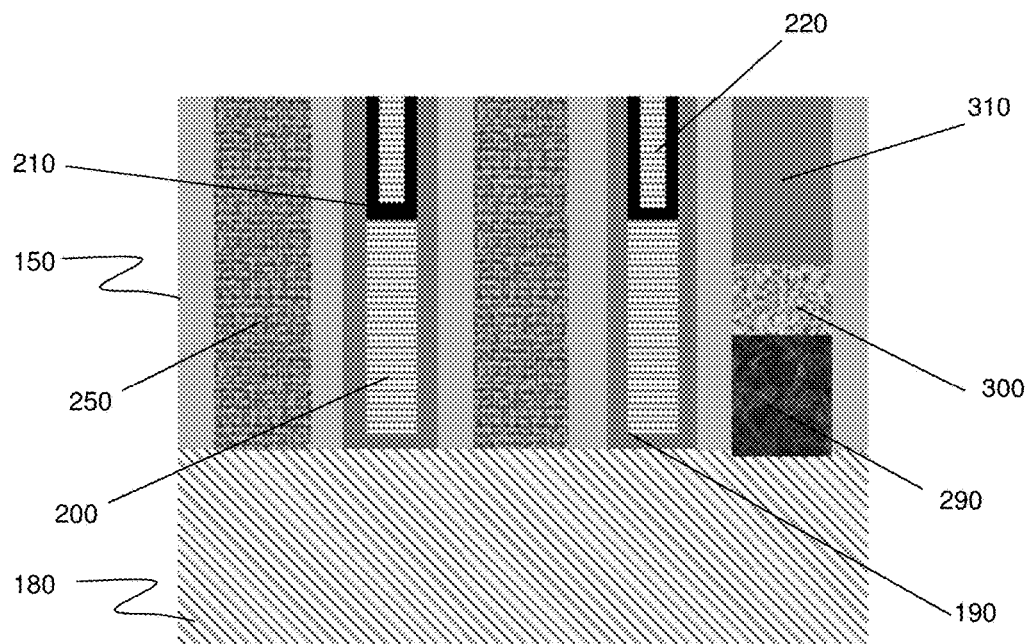

FIG. 11A shows recesses 320a formed by the removal of the liner 210 and FIG. 11B shows the oxide fill 220 and liner 210 being maintained over the STI region 180. In embodiments, the liner 210 can be removed by a RIE process selective to the low-k dielectric of the sidewall spacers 150. In alternative embodiments, the etching for the metallization features to the S/D regions 160 occurs and then liner 210 is etched in order to provide further protection to the low-k dielectric material of the sidewall spacers 150.

Figure 12A:
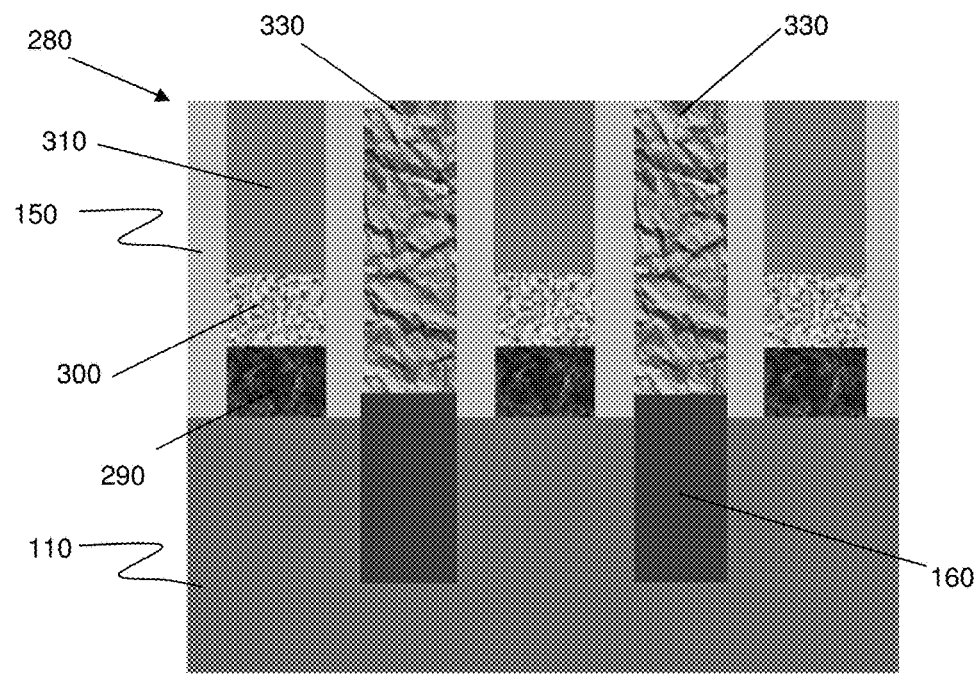
FIGS. 12A and 12B show source and drain contacts, amongst other features, and respective fabrication processes in accordance with aspects of the present disclosure.
Figure 12B:
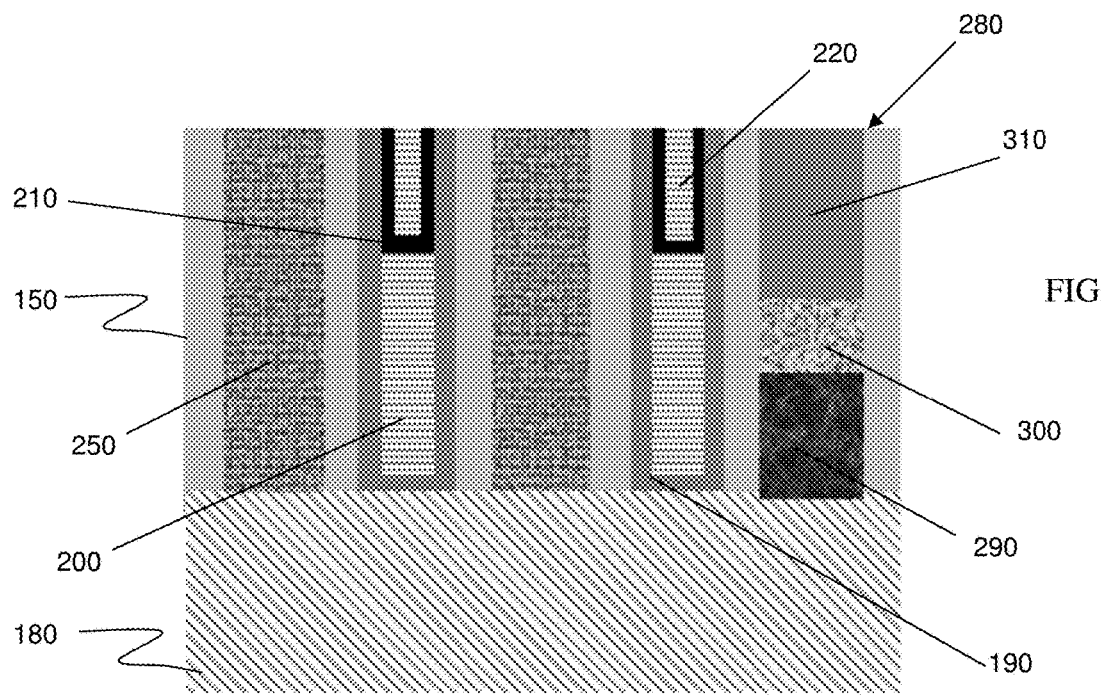

FIG. 12A shows source/drain metallization features 330 and FIG. 12B shows the oxide fill 220 and liner 210 being maintained over the STI region 180. In embodiments, trenches are formed in the ILD 200, which expose the S/D regions 160 using conventional lithography and etching techniques, e.g., RIE process. Specifically, this is a maskless process due to the materials being implemented.

A silicide liner is deposited in the trenches over the S/D regions 160 and then subjected to a silicide process. The silicide liner can be deposited using PVD or CVD processes. In embodiments, the silicide liner can be Ti, Ni, NiPt and Co, amongst other examples. Following the silicide process, a metal material is deposited on the silicide liner, thereby forming the source/drain metallization features 330. In embodiments, the metal material can be composed of cobalt (Co) or tungsten (W) or Ruthenium (Ru), for example. In further embodiments, there could be a thin metal liner material deposited before deposition metal of the metal material, e.g. TiN, TaN.

The deposition of the metal material is followed by a CMP polishing process down to the material of the gate cap 310. In this way, the structures and processes described herein provide for a plurality of gate structures 280 comprising a gate cap 310, sidewall spacers 150 and source and drain regions 160, source and drain metallization features 330 extending to the source and drain regions 160, and a liner 210 extending along an upper portion of the sidewall spacers 150 of at least one of the plurality of gate structures 280. The present disclosure further provides for a method which includes the steps of forming a plurality of gate structures 280 comprising source/drain regions 160, gate material, i.e., the gate metal 290 and the workfunction metal 300, sidewall spacers 150 and a gate cap 310 on the gate material, forming a liner 210 extending partially along an upper portion of the sidewall spacers of at least one of the plurality of gate structures 280, and a plurality of source/drain contacts, i.e., source/drain metallization features 330, in electrical contact with the source/drain regions 160. Additional steps include depositing an insulator material 220 over the liner 210, and forming an etch stop liner 190 encapsulating the insulator material 220 and the liner 210.

It should now be understood that the processes and resultant structures described herein will serve to further protect the metallization features of gate structure during fabrication processes by preventing gate height loss and preserving the height of the gate structures 120. The resultant structures, i.e., replacement gate structures 280 including relatively larger gate cap 310, will hence prevent shorts from occurring with interconnect or other wiring structures of the S/D regions 160. Accordingly, the processes and structures described herein will increase yield.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a plurality of gate structures comprising a gate cap, sidewall spacers and source and drain regions;
source and drain metallization features extending to the source and drain regions; and
a liner extending along an upper portion of a side surface of at least one of the sidewall spacers of at least one of the plurality of gate structures,
wherein the liner is U-shaped and includes a first vertical leg, a second vertical leg and a horizontal connecting portion connecting the first and second vertical legs,
wherein the first vertical leg extends along the upper portion of the side surface of the at least one of the sidewall spacers, and
wherein an internal portion of the U-shaped liner is filled with a first insulator material.

2. The structure of claim 1, wherein a height of the gate cap is greater than the liner.

3. The structure of claim 1, wherein the liner extends partially along a side surface of the gate cap.

4. The structure of claim 1, further comprising a second insulator material which is located under the horizontal connecting portion of the liner.

5. The structure of claim 4, further comprising an etch stop liner partially encapsulating the first and second insulator materials and the liner, and which is adjacent to the side surface of the at least one sidewall spacer of the at least one of the plurality of gate structures.

6. The structure of claim 5, wherein the liner, the first and second insulator materials and the etch stop liner are partially over a source and drain region of the at least one of the plurality of gate structures.

7. The structure of claim 5, wherein the etch stop liner is U-shaped and includes first and second vertical legs and a horizontal connecting portion connecting the first and second vertical legs.

8. The structure of claim 1, wherein the gate cap has a height in a range of 30 nm to 80 nm.

9. The structure of claim 1, wherein the plurality of gate structures further comprise a gate metal which has a height that does not extend past a bottom surface comprised of the horizontal connecting portion of the liner.

10. The structure of claim 9, wherein the gate cap extends below the bottom surface of the liner.

11. The structure of claim 1, further comprising:
a second insulator material which is located under the horizontal connecting portion of the liner; and
an etch stop liner partially encapsulating the first and second insulator materials and the liner, and which is adjacent to the side surface of the at least one sidewall spacer of the at least one of the plurality of gate structures,
wherein:
a height of the gate cap is greater than the liner;
the liner extends partially along a side surface of the gate cap;

the plurality of gate structures further comprise a gate metal which has a height that does not extend past a bottom surface comprised of the horizontal connecting portion of the liner;

the gate cap extends below the bottom surface of the liner;

the etch stop liner is U-shaped and includes first and second vertical legs and a horizontal connecting portion connecting the first and second vertical legs; and the horizontal connecting portion of the etch stop liner extends on an upper surface of a shallow trench isolation (STI) region formed under the plurality of gate structures.

12. A structure, comprising:

a plurality of gate structures comprising source/drain regions, gate material, sidewall spacers and a gate cap on the gate material;

a plurality of source/drain contacts in electrical contact with the source/drain regions;

an insulator material adjacent to a side surface of at least one of the sidewall spacers of at least one of the plurality of gate structures and extending along a lower portion of the side surface of the at least one of the sidewall spacers; and a liner extending partially along an upper portion of the side surface of the at least one of the sidewall spacers of at least one of the plurality of gate structures, above the insulator material, wherein the liner is U-shaped and includes a first vertical leg, a second vertical leg and a horizontal connecting portion connecting the first and second vertical legs, wherein the first vertical leg extends along the upper portion of the side surface of the at least one of the sidewall spacers, and wherein an internal portion of the U-shaped liner is filled with a second insulator material.

13. The structure of claim 12, wherein the gate cap has a height in a range of about 30 nm to 80 nm.

14. The structure of claim 12, wherein the liner is composed of a metal oxide or a nitride material.

15. The structure of claim 12, further comprising an oxide fill adjacent to one of the plurality of gate structures and adjacent along a longitudinal axis of remaining gate structures of the plurality of gate structures.

16. The structure of claim 12, further comprising an etch stop liner partially encapsulating the insulator material adjacent to the sidewall spacers of the at least one of the plurality of gate structures.

17. The structure of claim 16, wherein the liner, the insulator material and the etch stop liner is partially over a source and drain region of the at least one of the plurality of gate structures.

18. A method, comprising:

forming a plurality of gate structures comprising source/drain regions, a gate material, sidewall spacers and a gate cap on the gate material;

forming a liner extending partially along an upper portion of a side surface of at least one of the sidewall spacers of at least one of the plurality of gate structures; and a plurality of source/drain contacts in electrical contact with the source/drain regions, wherein the liner is U-shaped and includes a first vertical leg, a second vertical leg and a horizontal connecting portion connecting the first and second vertical legs, wherein the first vertical leg extends along the upper portion of the side surface of the at least one of the sidewall spacers, and wherein an internal portion of the U-shaped liner is filled with a first insulator material.

19. The method of claim 18, further comprising forming the liner over a second insulator material.

20. The method of claim 19, further comprising forming an etch stop liner encapsulating the are just shipped as one insulator material and the liner.

* * * * *